(12) United States Patent
Hallman et al.

(10) Patent No.: US 9,671,468 B2
(45) Date of Patent: Jun. 6, 2017

(54) BATTERY WITH COMPUTING, SENSING AND COMMUNICATION CAPABILITIES

(71) Applicant: MICROSOFT TECHNOLOGY LICENSING, LLC, Redmond, WA (US)

(72) Inventors: Kimberly Denise Auyang Hallman, Bellevue, WA (US); Desney Tan, Kirkland, WA (US); Ira Snyder, Bellevue, WA (US); Peter Glaskowsky, Carnation, WA (US); Mats Myrberg, Seattle, WA (US); Dave Rohn, Fort Collins, CO (US); Michael Hall, Snohomish, WA (US); Michael Koenig, Bellevue, WA (US); Andrew Wilson, Seattle, WA (US); Matthew Dyor, Bellevue, WA (US)

(73) Assignee: MICROSOFT TECHNOLOGY LICENSING, LLC, Redmond, WA (US)

( * ) Notice: Subject to any disclaimer, the term of this patent is extended or adjusted under 35 U.S.C. 154(b) by 776 days.

(21) Appl. No.: 13/671,260

(22) Filed: Nov. 7, 2012

(65) Prior Publication Data

US 2014/0129162 A1    May 8, 2014

(51) Int. Cl.
   *G01R 31/36*   (2006.01)
   *H01M 10/48*   (2006.01)
   (Continued)

(52) U.S. Cl.
   CPC ..... *G01R 31/3606* (2013.01); *G01R 31/3689* (2013.01); *H01M 10/42* (2013.01);
   (Continued)

(58) Field of Classification Search
   USPC .......................................................... 702/63
   See application file for complete search history.

(56) References Cited

U.S. PATENT DOCUMENTS 5,971,597 A    10/1999   Baldwin et al.
6,796,187 B2    9/2004   Srinivasan et al.
(Continued)

FOREIGN PATENT DOCUMENTS

CN    102570535 A    7/2012
WO    2007102668 A1   9/2007

OTHER PUBLICATIONS

Alaei, M., J. M. Barceló-Ordinas, Node clustering based on overlapping FoVs for wireless multimedia sensor networks, Proc. of the 2010 IEEE Wireless Communications and Networking Conf., WCNC 2010, Apr. 18-21, 2010, pp. 1-6, Sydney, Australia.
(Continued)

*Primary Examiner* — Paul D Lee
(74) *Attorney, Agent, or Firm* — Lyon & Harr, LLP; Richard T. Lyon (57) ABSTRACT

Electrical battery apparatus embodiments are presented that generally involve incorporating sensing, computing, and communication capabilities into the one common component that a vast number of electronic devices employ—namely batteries. By integrating these capabilities into disposable and/or rechargeable batteries, new functionality and intelligence can be provided to otherwise stand-alone devices.

20 Claims, 2 Drawing Sheets

(51) Int. Cl.
  H04L 29/08  (2006.01)
  H04W 4/02  (2009.01)
  H04W 52/02  (2009.01)
  H04Q 9/00  (2006.01)
  *H01M 10/42*  (2006.01)
  *H02J 7/00*  (2006.01)

(52) U.S. Cl.
  CPC ............ *H01M 10/48* (2013.01); *H04L 67/12* (2013.01); *H04Q 9/00* (2013.01); *H04W 4/02* (2013.01); *H04W 52/0296* (2013.01); *H01M 10/425* (2013.01); *H01M 2010/4278* (2013.01); *H02J 2007/0098* (2013.01); *H04Q 2209/10* (2013.01); *Y02B 60/50* (2013.01)

(56) References Cited

U.S. PATENT DOCUMENTS

| | | | |
|---|---|---|---|
| 6,909,921 | B1 | 6/2005 | Bilger |
| 7,847,699 | B2 | 12/2010 | Lee et al. |
| 2003/0201929 | A1 | 10/2003 | Lutter et al. |
| 2004/0121882 | A1* | 6/2004 | Tajima ............... B60K 6/485 477/3 |
| 2006/0087286 | A1 | 4/2006 | Phillips et al. |
| 2006/0136759 | A1 | 6/2006 | Koo |
| 2007/0229032 | A1 | 10/2007 | Elder et al. |
| 2008/0206627 | A1 | 8/2008 | Wright |
| 2009/0319569 | A1 | 12/2009 | Parks |
| 2009/0325044 | A1 | 12/2009 | Rajpara et al. |
| 2010/0082198 | A1* | 4/2010 | Arai et al. ............. 701/29 |
| 2010/0138093 | A1* | 6/2010 | Oku et al. ............. 701/22 |
| 2010/0182157 | A1 | 7/2010 | Shaffer |
| 2011/0068746 | A1 | 3/2011 | Rocci |
| 2011/0074596 | A1 | 3/2011 | Frohlick et al. |
| 2012/0101755 | A1 | 4/2012 | Hirasawa |
| 2012/0299721 | A1* | 11/2012 | Jones ..................... 340/521 |

OTHER PUBLICATIONS

Analog Devices, Inc., ADUC7034: Integrated precision battery sensor for automotive, Data Sheet, May 2010, pp. 1-136, retrieved from http://www.analog.com/static/imported-files/data_sheets/ADuC7036.pdf.

Apple Computer, Inc., Nike + iPod: About the sensor battery, Apple Support, Jan. 20, 2010, pp. 1-2, retrieved from http://support.apple.com/kb/HT1400.

Argus Analyzers, Automotive battery monitoring system, pp. 1-2, retrieved May 14, 2012 from http://www.argusanalyzers.com/embedded-battery-sensors/automotive-sensors.html.

Boice, J., X. Lu, C. Margi, G. Stanek, G. Zhang, K. Obraczka, Meerkats: A power-aware, self-managing wireless camera network for wide area monitoring, Distributed Smart Cameras Workshop—SenSys06, Technical Report UCSC-CRL-05-04, Oct. 2006, pp. 1-13.

Brashear, H., T. Starner, P. Lukowicz, H. Junker, Using multiple sensors for mobile sign language recognition, Proc. of the Seventh IEEE Int'l Symposium on Wearable Computers, ISWC 2003, Oct. 21, 2003, pp. 45-52.

Delphi Corp., Delphi IVT Battery Sensor, Mar. 27, 2008, p. 1, retrieved from http://delphi.com/shared/pdf/ppd/sensors/et_ivt.pdf.

EE Times Asia, Smart battery sensor targets auto, industrial, medical batteries, May 15, 2012, pp. 1-2, retrieved from http://www.eetasia.com/ART_8800666960_765245_NP_7bdae7b1.HTM.

Hella Electronics Corp., Intelligent battery sensors, May 2007, pp. 1-2, retrieved from http://www.hella.nl/produktion/HellaNL/WebSite/MiscContent/Download/Automobilindustrie/Booklets_Flyer/ELO_Ibs_Flyer.pdf.

Margi, C. B., V. Petkov, K. Obraczka, R. Manduchi, Characterizing energy consumption in a visual sensor network testbed, 2nd Int'l Conf. on Testbeds & Research Infrastructures for the DEvelopment of NeTworks & COMmunities, TRIDENTCOM 2006, Mar. 1-3, 2006, pp. 331-339, Barcelona, Spain.

Margi, C. B., R. Manduchi, K. Obraczka, Energy consumption tradeoffs in visual sensor networks, Proc. of 24th Brazilian Symposium on Comp. Networks, SBRC 2006, Jun. 2006, pp. 16, Curitiba, Brazil.

Shih, E., P. Bahl, M. J. Sinclair, Wake on wireless: An event driven energy saving strategy for battery operated devices, Proc. of the Eighth Annual Int'l Conf. on Mobile Computing and Networking, MOBICOM 2002, Sep. 23-26, 2002, pp. 160-171, Atlanta, Georgia, USA.

Wang, Y., J. Lin, M. Annavaram, Q. Jacobson, J. I. Hong, B. Krishnamachari, N. M. Sadeh, A framework of energy efficient mobile sensing for automatic user state recognition, Proc. of the 7th Int'l Conf. on Mobile Sys's, Mobile Sensing and Inference, MobiSys 2009, Jun. 22-25, 2009, pp. 179-192, Kraków, Poland.

Zhu, Y., Y. Liu, L. M. Ni, Z. Zhang, Low-power distributed event detection in wireless sensor networks, 26th IEEE Int'l Conf. on Comp. Comm., INFOCOM 2007, May 6-12, 2007, pp. 2401-2405, Anchorage, Alaska, USA.

Zilan, R., J. M. Barcelo-Ordinas, B. Tavli, Available mote platforms for wireless image sensors, Technical Report UPC-DAC-RR-XCSD-2008-4, Sep. 2008, pp. 24, retrieved from https://www.ac.upc.edu/app/research-reports/html/2008/9/Motes.pdf.

"International Search Report & Written Opinion for PCT Patent Application No. PCT/US2013/068988", Mailed Date: Oct. 6, 2014, 11 Pages.

"International Preliminary Report on Patentability Issued in PCT Application No. PCT/US2013/068988", Mailed Date: Jun. 18, 2015, 8 Pages.

"First office Action and Search Report Issued in Chinese Patent Application No. 201380058393.5", Mailed Date: Jul. 6, 2016, 12 Pages.

* cited by examiner

BATTERY WITH COMPUTING, SENSING AND COMMUNICATION CAPABILITIES

BACKGROUND

An electrical battery has an electrochemical cell, or multiple interconnected cells, used to convert stored chemical energy into electrical energy. A vast number of electronic devices currently employ batteries as their main or backup power source. These electronic devices vary in size and power requirements from tiny devices (such as a hearing aid) to room sized devices (such as a computer data center). As such, batteries are made in a variety of sizes and shapes. For example, small devices often employ tiny wafer-shaped button batteries. Many larger devices employ the well known cylindrical-shaped batteries which are designated by size (e.g., AAA, AA, C, D). Electrical batteries can be of the disposable type, which are discarded after their stored chemical energy has been exhausted, or they can be of the rechargeable type, whose chemical energy can be restored multiple times via well-known recharging procedures.

SUMMARY

Electrical battery apparatus embodiments described herein generally involve incorporating sensing, computing, and communication capabilities into the one common component that a vast number of electronic devices employ—namely the previous-described batteries. By integrating these capabilities into disposable and/or rechargeable batteries, new functionality and intelligence can be provided to otherwise stand-alone devices.

In one embodiment, an electrical battery apparatus includes one or more electrical batteries that power a separate electronic device. In addition, there are one or more sensors that monitor the electrical battery conditions or external conditions, or both. The sensors are in communication with a computing device. The computing device includes a computer program having program modules which are executed to at least control the operation of each sensor. The computing device can also be configured to include an interface component that communicates with a remote computing device over a data communication network (such as the Internet or a proprietary intranet) via a transmitter coupled to the interface component. Further, in one embodiment, electrical battery apparatus includes a power control device that controls the amount of power supplied by the one or more electrical batteries to the separate electronic device, and which is in communication with the computing device.

In another embodiment, the aforementioned electronics are embedded in a case that fits around commercially available batteries. This electronic battery apparatus embodiment includes a power control device, sensor or sensors, transmitter and computing device (along with its computer program as in the previously-described embodiment). These electronic components are embedded in a support structure that receives and retains one or more electrical batteries. This structure includes electrical contacts that transfer electrical current from the one or more electrical batteries to a separate electronic device so as to power that device.

It is noted that this Summary is provided to introduce a selection of concepts, in a simplified form, that are further described below in the Detailed Description. This Summary is not intended to identify key features or essential features of the claimed subject matter, nor is it intended to be used as an aid in determining the scope of the claimed subject matter.

DESCRIPTION OF THE DRAWINGS

The specific features, aspects, and advantages of the disclosure will become better understood with regard to the following description, appended claims, and accompanying drawings where:

DETAILED DESCRIPTION

In the following description of electrical battery apparatus embodiments reference is made to the accompanying drawings which form a part hereof, and in which are shown, by way of illustration, specific implementations. It is understood that other implementations may be utilized and structural changes may be made without departing from the scope of the described embodiments.

It is also noted that for the sake of clarity specific terminology will be resorted to in describing the electrical battery apparatus embodiments described herein and it is not intended for these embodiments to be limited to the specific terms so chosen. Furthermore, it is to be understood that each specific term includes all its technical equivalents that operate in a broadly similar manner to achieve a similar purpose. Reference herein to "one embodiment", or "another embodiment", or an "exemplary embodiment", or an "alternate embodiment", or "one implementation", or "another implementation", or an "exemplary implementation", or an "alternate implementation" means that a particular feature, a particular structure, or particular characteristics described in connection with the embodiment or implementation can be included in at least one embodiment of an electrical battery apparatus. The appearances of the phrases "in one embodiment", "in another embodiment", "in an exemplary embodiment", "in an alternate embodiment", "in one implementation", "in another implementation", "in an exemplary implementation", "in an alternate implementation" in various places in the specification are not necessarily all referring to the same embodiment or implementation, nor are separate or alternative embodiments/implementations mutually exclusive of other embodiments/implementations. Yet furthermore, the order of process flow representing one or more embodiments or implementations does not inherently indicate any particular order nor imply any limitations.

1.0 Electrical Battery Apparatus

Electrical battery apparatus embodiments described herein generally involve incorporating sensing, computing, and communication capabilities into the one common component that a vast number of electronic devices employ—namely the previous-described batteries. By integrating these capabilities into disposable and/or rechargeable batteries, new functionality and intelligence can be provided to otherwise stand-alone ("dumb") devices. It is not even necessary that the host electronic device is aware of the presence or capabilities of the electrical battery apparatus.

Figure 1:
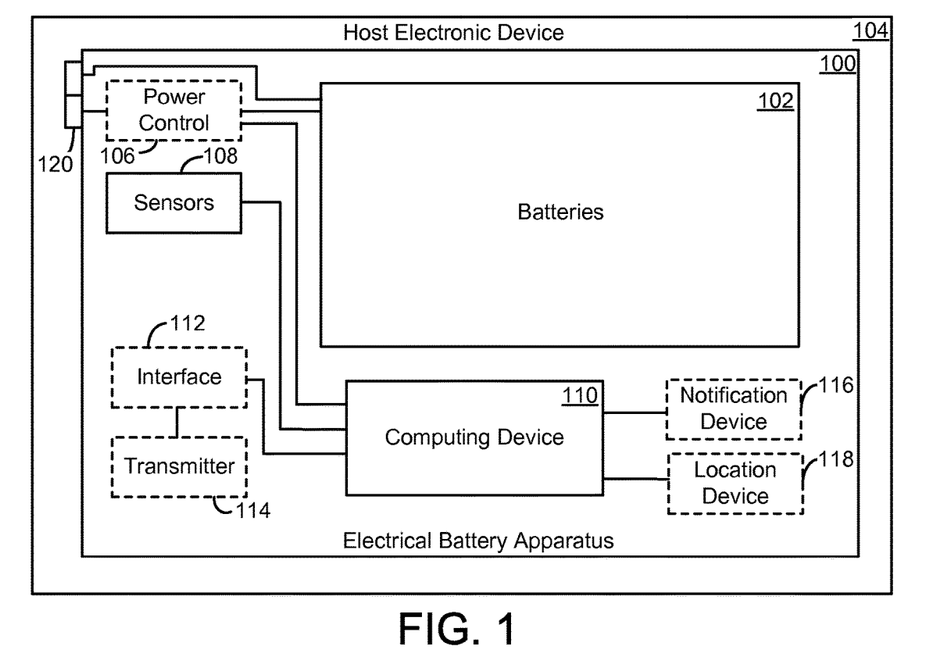
FIG. 1 is a simplified diagram of an electrical battery apparatus embodiment that includes sensing electronics, a power control device, a transmitter, a computing device and batteries.

In one embodiment, the sensing, computing, and communication electronics are incorporated directly into the battery and the resulting electrical battery apparatus is sized to fit within a battery compartment of a battery-powered electronic device. More particularly, referring to FIG. 1, in one general embodiment an electrical battery apparatus 100 includes one or more electrical batteries 102 that power a separate electronic device 104, via electrical contacts 120. Also, optionally included is a power control device 106 that controls the amount of power supplied by the electrical battery or batteries 102 to the separate electronic device 104. In addition, there are one or more sensors 108 that can monitor the electrical battery conditions or external conditions, or both. The power control device 106 and each of the sensors 108 are in communication with a computing device 110 (such as described in the Exemplary Operating Environments section to follow). The computing device 110 includes a computer program having program modules which are executed to at least control the operation of the power control device and each sensor (and optionally other devices as will be described shortly).

Figure 2:
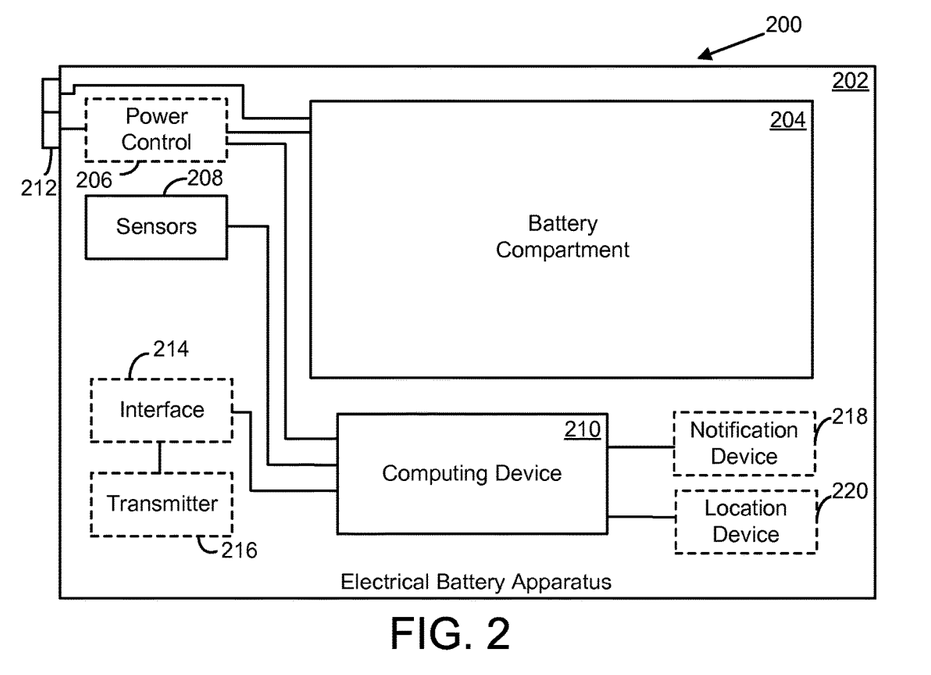
FIG. 2 is a simplified diagram of an electrical battery apparatus embodiment that has a case which includes sensing electronics, a power control device, a transmitter, a computing device; and which receives and retains one or more electrical batteries.

In another embodiment, the aforementioned electronics are embedded in a case that fits around commercially available batteries as there is usually some space on the ends of the battery as well as around the edges that can be used to include the electronics. In general, referring to FIG. 2, this electronic battery apparatus embodiment 200 includes an optional power control device 206, sensor or sensors 208 and computing device 210 (along with its computer program) as described above. These electronic components are embedded in a support structure 202 that receives and retains one or more electrical batteries (not shown) in a battery compartment 204. This structure 202 includes electrical contacts 212 that transfer electrical current from the one or more electrical batteries to a separate electronic device (not shown) so as to power that device.

In general, the aforementioned support structure is sized to fit within a battery compartment of a battery-powered electronic device. However, there may be situations where the battery compartment is too small to accommodate both the above-described electronic battery case and its components with batteries installed. In one embodiment, this is handled by opting for physically smaller sized batteries than would normally be installed in the battery compartment of the electronic device, albeit having the same voltage and current capabilities (or modified by additional components in the support structure to match the voltage and current capabilities of the original batteries). The additional room afforded by the smaller batteries then allows for more space in the support structure for the previously-described components. For example, in one implementation, standard AA sized batteries are replaced with standard AAA sized batteries, so as to afford more room in the support structure for its components.

It is also noted that in either of the above-described electrical battery apparatus embodiments, the on-board computing device can be configured, in one implementation, to include an interface component (112 in FIGS. 1 and 214 in FIG. 2) that communicates with a remote computing device. This could be a standard hardwired interface (not shown), or as will be described in more detail later can be a wireless interface coupled to a transmitter (114 in FIGS. 1 and 216 in FIG. 2). This transmitter can be any appropriate wireless transmitter operating in radio or optical (e.g., infrared) frequencies. The optional nature of some of the foregoing components is indicated via the dashed-lined boxes in FIG. 1 and FIG. 2.

2.0 Sensing, Computing and Communication Features

As indicated previously, the electrical battery apparatus described herein includes a computing device with a computer program used to at least control the operation of each sensor (and optionally other devices such as the power control device). As such, a variety of advantageous sensing, computing and communication features can be realized. Examples of such features include, but are not limited to, those described in the following sections. It is noted that for those embodiment involving control over the power supplied to the host electronic device, it will be assumed that the aforementioned power control device is installed in the apparatus.

2.1 Tracking and Recording Power Usage and Sensor Data

In one embodiment the aforementioned sensors also monitor electrical battery conditions. Thus, based on the power draw from the battery, or on output of other embedded sensors (such as accelerometers, thermometers, and so on), it is possible to track usage patterns. These usage patterns provide information that indicates if and when the battery-powered electronic device hosting the electrical battery apparatus or electronic battery case is still being used. For example, but without limitation, if the host electronic device is a child's toy, the usage pattern data can be analyzed to determine if the toy is still being played with, or if it is just sitting around and should be discarded or sold.

It is noted that in some scenarios, the electrical battery apparatus may not know what type of electronic device it is installed into, thus inhibiting the analysis of the power usage patterns, among other things. However, if the power usage pattern for a particular type of electronic device is predictable, it is possible that the recorded patterns can be employed to automatically detect the type of device. As such, analyzing the power usage patterns of the host electronic device (among other things) would become more feasible.

Thus, in one embodiment, the computer program running on the computing device in the electrical battery apparatus includes a module for tracking and recording battery power usage patterns. Further, in one embodiment, the electrical battery apparatus includes a notification device (116 in FIGS. 1 and 218 in FIG. 2), which is in communication with the computing device. In one implementation, the aforementioned computer program includes a module that notifies a user of the battery-powered electronic device of the recorded battery power usage patterns via the user notification device. The notification device can take any of several forms (e.g., visual, audible, haptic, or any combination thereof). For example, but without limitation, the notification device can be a set of lights, audio speaker or speakers, a vibration device, a display screen, and so on. Still further, in one implementation, the aforementioned computer program includes a module that employs the aforementioned transmitter to transmit the recorded battery power usage patterns via a standard data communication network to a remote computing device.

Additionally, in one embodiment, the computer program running on the computing device in the electrical battery apparatus includes a module for tracking and recording sensor data output by each sensor. In one implementation, the aforementioned computer program includes a module that notifies a user of the battery-powered electronic device of the recorded sensor data via the user notification device. Still further, in one implementation, the aforementioned computer program includes a module that employs the aforementioned transmitter to transmit the recorded sensor data via a standard data communication network to a remote computing device. In yet another embodiment, the power control device is part of the apparatus, and the aforementioned computer program includes a module that controls the amount of power supplied to the host electronic device based on sensor data output by at least one of the one or more sensors. The battery power is controlled using the aforementioned power control device.

Further, in the embodiment where the computer program running on the computing device in the electrical battery apparatus includes a module for tracking and recording sensor data output by each sensor of the apparatus, and a module that employs the aforementioned transmitter to transmit the recorded sensor via a standard data communication network to a remote computing device, the remote computer can employ a group of such apparatuses to form a sensor network. Monitoring sensor data coming in from a group of electrical battery apparatuses can also be quite useful. For example, the remote computing device can take advantage of a sensor network created in a space (e.g., house or office) where each electrical battery apparatus in the group includes a temperature sensor and are scattered throughout the space to effect more efficient heating and cooling as controlled by the remote computing device.

2.2 Location Sensing

The aforementioned sensor(s) in the electrical battery apparatus could also sense the current location of the host electronic device, either in relation to other objects (e.g., other electronic devices employing the electrical battery apparatus), or as an absolute value within an environment (e.g., using WiFi localization). This could allow devices to act intelligently when moved. For example, but without limitation, knowing the location of the host electronic device could be used to decide when to turn the device on and off (e.g. microphone recording device will shut itself down when in confidential space, or a child's toy will not work in the kitchen). This location feature can also be employed to notify a user when a host electronic device is leaving or has left its assigned or logical area (e.g., a remote control for a television or radio-controlled toy car could beep when removed from a specified area). If the electrical battery apparatus is in communication with a remote computing device, it can send a location message to that device. This can be advantageous in a number of ways. For example, but without limitation, the user could find the location of a misplaced or stolen electronic device that is hosting the electrical battery apparatus or electronic battery case. A location log could also be generated locally and later transmitted to a remote computing device, or the electrical battery apparatus could periodically transmit its current location to the remote computing device and that device could generate the log.

Thus, in one embodiment, the electrical battery apparatus includes a location determining device (118 in FIGS. 1 and 220 in FIG. 2), which is in communication with the computing device. The location determining device determines the location of the electrical battery apparatus (and so the host battery-powered electronic device). In one embodiment, the aforementioned computer program includes a module that identifies a current absolute location of the electrical battery apparatus using the location determining device, or indicates that the electrical battery apparatus is within the prescribed distance of an particular object. And in another embodiment, the computer program also includes a module that employs the aforementioned user notification device to notify a user of the host electronic device of its current relative or absolute location.

Further, in yet another embodiment, the computer program also includes a module that employs the aforementioned transmitter to transmit the aforementioned location data via a standard data communication network to a remote computing device. If each electrical battery apparatus in a group of host electronic devices includes a location sensing device such as described previously and were scattered about a space, the remote computer could use the incoming location data to map the space or the current location of the group of apparatuses in the space. Thus, for instance, the location of battery-powered equipment or people carrying a host electronic device could be mapped.

2.3 Gesture and Motion Sensing

Electronic devices that do not typically have gesture or motion sensing capabilities can be augmented with them via the electrical battery apparatus. By incorporating motion sensors or orientation sensors, or both (e.g., accelerometers and/or gyros) in the electrical battery apparatus, it is possible to sense movement and identify explicit gestures (e.g., shaking, bumping, or so on). This capability can be advantageously used for a variety of operations.

For example, but without limitation, in one embodiment the aforementioned computer program includes a module that recognizes motion that is indicative of the host electronic device being handled too roughly. If excessively rough handling is detected, the module would employ the aforementioned power control device to turn the host device off. For instance, if a child is tapping a touch screen too hard, the host device would be shut off—thereby ultimately teaching the child how to use the touch screen properly. Similarly, if motion is detected that is indicative of the host electronic device having been dropped, the host device could be immediately shut off in an attempt to minimize damage upon impact with the ground.

Another example, again without limitation, involves an embodiment of the aforementioned computer program that includes a module for recognizing motion that is indicative of the host electronic device being bumped into another electronic device (which may or may not also employ an electrical battery apparatus). If a bump is detected, the module would initiate an existing host electronic device operation to pair the bumped devices. For instance, bumping a host smart phone against a wireless keyboard causes the two devices to be paired.

Yet another example, again without limitation, involves an embodiment of the aforementioned computer program that includes a module for recognizing motion that is indicative of a user instruction. If a prescribed gesture (e.g., shaking the host electronic device in a prescribed manner) is detected, the module would identify the intended instruction from a group of pre-saved gestures and initiate the execution of the instruction. For instance, the detected gesture could indicate that the user wants to be notified of the recorded battery power usage patterns via the user notification device in the manner described previously.

2.4 Authentication

Given the previously-described location sensing capabilities, it is further possible to implement authentication features using the electrical battery apparatus. In other words, if the electrical battery apparatus senses its (and so the host electronic device's) proximity to a different electronic device, this could be used for authentication. For example, but without limitation, if the electrical battery apparatus is employed in a battery-operated power tool, power could be withheld unless a pair of safety goggles is detected in close proximity. The safety goggles in this scenario would be electronically-detectable using conventional methods, or known to be at a particular location via other means. Another example, again without limitation, involves supplying power to the host electronic device only if it is detected to be in close proximity to a particular hardware key carried by an individual authorized to use the host device. Thus, use of the host electronic device would be restricted to only people having the correct hardware key in their possession. Yet another example, again without limitation, involves using the proximity feature for billing purposes. In this scenario, the host electronic device's proximity to a particular location or object would be logged, and the log would be used to charge the user of the host device for using the facilities at the logged location or using the object. If the electrical battery apparatus is in communication with a remote computing device, it could send the proximity log to the remote computing device, or the electrical battery apparatus could periodically transmit its proximity to a particular location or object to the remote computing device and that device could generate the proximity log. Either way, the proximity log would be used to bill the user of the host electronic device.

Thus, in one embodiment, the aforementioned computer program includes a module that identifies if a particular object is within a prescribed distance of the electrical battery apparatus based on the output of the aforementioned sensor(s). And in another embodiment, the computer program also includes a module that supplies power to the host electronic device (using the power control device) only when the aforementioned object has been identified as being within the prescribed distance of the electrical battery apparatus. Further, in yet another embodiment, the computer program includes a module transmits a message (using the aforementioned transmitter) to a remote computing device via a data communication network that indicates the electrical battery apparatus is within the prescribed distance of a particular location or object.

2.5 Power Management

Since the electric battery apparatus has knowledge of the power consumption and the surrounding environment (via the sensors), and control over the power usage of the host electronic device (via the power control device), it is possible to implement various power management features. For example, but without limitation, the host electronic device can be turned off under certain conditions such as the time of day (e.g., automatically turned off at night), certain temperatures that might be harmful to the host device or batteries (e.g., the device is left in a hot car for an extended period of time), certain usage patterns (e.g., turned off when not moved or otherwise sensed not to be in use for a prescribed period of time), when not in proximity of a detectable person or object (e.g., turns off when the user of the host electronic device is not in close proximity), when the host electronic device is in a certain location (e.g., turns off when in a meeting room, movie theater, school or other location where the host device might be distracting), and so on. The host electronic device can also be turned on under certain conditions such as the time of day (e.g., automatically turned on in the morning), when in proximity of a detectable person or object (e.g., turns on when the user of the host electronic device is in close proximity), when it is moved (e.g., the user picks up or shakes the host electronic device), and so on.

It is noted that in the foregoing examples, and others not specifically described herein, turning the host electronic device off or on may not be appropriate. It may be more appropriate to vary the power provided to the host electronic device rather than shut it off, or fully power it. For instance, certain features of the host device may require continuous power (e.g., a clock) and so shutting off power completely would adversely affect such a feature. Accordingly, stating that power is minimized or maximized (which could include shutting the device off or fully powering it) based on certain sensed conditions or locations, is the more comprehensive and should be read into the foregoing examples.

It is further noted that in view of the previously-described tracking and recording of power usage and sensor data (including location), it is possible to analyze the data and predict circumstances or times when power can be advantageously minimized or maximized to a host electronic device. Thus, rather than relying on prescribed logic rules (such as minimize power at night), the logic can be tailored to the host device's use patterns (such as minimizing power during times the host device is typically not being used).

Given the foregoing, in one embodiment, the aforementioned computer program includes a module that predicts battery power usage based on the recorded battery power usage or sensor patterns. And in another embodiment, the computer program also includes a module that minimizes battery power consumption by the host electronic device (using the power control device) at times when based on the predicted battery power usage the host electronic device is not being used.

Further, it is possible that the module that predicts battery power usage based on the recorded battery power usage or sensor patterns could identify a recurring period of high demand. This can be significant since the electrical battery apparatus also draws power from the batteries to operate. If the power demands of the electrical battery apparatus coupled with the power demands of the host electronic device would drain the batteries at an unacceptable rate, then steps could be taken to minimize the power demands of the electrical battery apparatus itself (e.g., shutting down sensors, notification devices, transmitter, and so on). Thus, in one embodiment, the computer program includes a module that minimizes battery power consumption by the electrical battery apparatus at times of higher power demand by the host electronics device based on the predicted battery power usage of the electrical battery apparatus and host electronic device.

And in yet another embodiment, the computer program includes a module that controls battery power provided to the host electronic device (using the power control device) based on its current location. Thus, the amount of power provided could be throttled or minimized in locations where the host electronic device is typically not used or should not be used. For example, but without limitation, a remote-controlled toy car employing the electrical battery apparatus could be provided with only half the maximum power when it is located indoors to reduce the possibility of damage to its surroundings.

2.6 Recharging

It is also noted that in view of the previously-described tracking and recording of power usage, it is possible to effect the recharging of the batteries when the electrical battery apparatus employs rechargeable batteries. This can involve notifying the user of the host electronic device via the aforementioned notification device of the need to recharge the batteries. It is noted that this can also be timed so as to take into consideration recorded power usage patterns. For example, but without limitation, suppose the recorded power usage patterns indicated heavy usage at a particular time later in the day when recharging is never attempted (thereby assuming that recharging is not possible during that time), and that while the amount of power currently available is sufficient for the near term predicted usage, it will not be enough to meet the anticipated power demand of later in the day. In such a case, the user would be notified of the need to recharge (or replace) the batteries even though the current power level would not usually justify immediate action.

Another advantageous scenario for recharging the batteries of the electrical battery apparatus involves automated and autonomous charging. In one embodiment, the electrical battery apparatus calls for a recharge when the batteries are running low on power. The recharge itself could be done with a directional wireless charger (e.g., plugged into a wall outlet and directing power towards the device), or effected by an autonomous robot that moves to the location of the electrical battery apparatus and inductively recharges it. In theory, the user would never have to worry about batteries again.

To this end, in one embodiment, the computer program includes a module that determines whether the batteries need to be recharged (e.g., based on the recorded battery power usage patterns), and which transmits a recharge request (using the aforementioned transmitter via a data communication network) to either a remote charging device (such as those mentioned previously) or to a remote computing device that controls remote charging device.

3.0 Aggregate System

There is a proliferation of internet-connected devices: computers, sensors, actuators. Some estimates project over 50 billion such devices deployed by the year 2020. These devices are already starting to pervade homes, workplaces, vehicles, and public spaces. They watch, listen, sense environmental conditions; they infer context and actions; they anticipate and mediate user interactions with the world; they allow humans to be more effective. However, since many of these technologies are being developed independently of one another, a world of stand-alone point-solutions of "dumb" sensing and actuation systems is being created, each of which is specialized to do a very small set of tasks. The electrical battery apparatus described herein provides an opportunity for these stand-alone devices to operate collectively.

In the foregoing description of the various electrical battery apparatus embodiments, a transmitter was sometimes employed to send recorded battery power usage patterns or sensor data, location data, and recharge requests to a remote computing device. While this information can be useful with regard to just the single electrical computing device employing the electrical battery apparatus, it can become even more useful when coupled with multiple electronic devices each employing the electrical battery apparatus. By integrating the communication logic, identification, etc. into multiple electrical battery apparatus-equipped electronic devices, a vast network can be established from existing devices.

The value of the foregoing network of electrical battery apparatus-equipped electronic devices becomes even greater if the communication between each device and a remote computer (or computers) is two-way. In a two-way scenario, the electrical battery apparatus of each host electronic device can not only transmit information to a remote computer, but can also receive data and instructions. This opens up a wide variety of possibilities in that a central controller can control coordinated system of heretofore stand-alone ("dumb") devices and enable more sophisticated functions not previously available until these devices became part of an aggregated system. For example, but without limitation, two-way communication with a remote computer allows a user of the remote computer to program, calibrate, and monitor all the functionality distributed into the previously described components. In addition, this would permit central/global control of the sensors/devices (through each electrical battery apparatus).

More particularly, a two-way communication scenario would allow a newly activated electrical battery apparatus (e.g., newly installed in its host electronic device) to join a network of such apparatuses. For example, in one embodiment, a newly activated electrical battery apparatus would execute a pre-programmed module of the aforementioned computer program to search for an appropriate electrical battery apparatus network via data communication network. Alternately, the newly activated electrical battery apparatus can be configured to connect to the data communication network and wait for a message inviting it to join an electrical battery apparatus network. Once an appropriate network is identified, the newly activated electrical battery apparatus can be configured to provide identification info (e.g., a unique identifier, its location, a password, and so on) so as to register with the electrical battery network. Once registered, the remote computer associated with the electrical battery network can download additional program modules to the computing device appropriate for the purpose of the network.

3.1 Electrical Battery Apparatus with Two-Way Communication Capability

Figure 3:
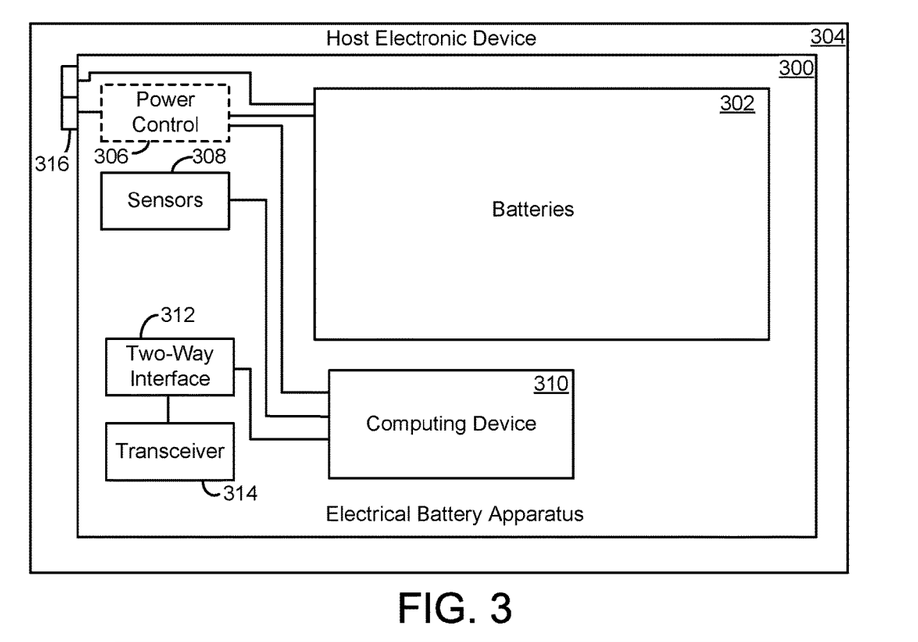
FIG. 3 is a simplified diagram of an electrical battery apparatus embodiment that includes sensing electronics, a power control device, a transceiver, a computing device and batteries.

In one embodiment, sensing, computing, and two-way communication electronics are incorporated directly into each electrical battery apparatus. More particularly, referring to FIG. 3, a two-way communication version of the electrical battery apparatus 300 includes one or more electrical batteries 302 that power a separate electronic device 304, via electrical contacts 316. An optional power control device 306 that controls the amount of power supplied by the electrical battery or batteries 302 to the separate electronic device 304 can also be included. In addition, there are one or more sensors 308 that monitor the electrical battery condition or external conditions, or both. The power control device 306 and each of the sensors 308 are in communication with a computing device 310 (such as described in the Exemplary Operating Environments section to follow). The computing device 310 includes a computer program having program modules which are executed to at least control the operation of the power control device (if included) and each sensor, as well as optionally other devices. In addition, the computing device 310 includes a two-way communication interface component 312 that communicates with a remote computing device. This could be a standard hardwire interface (not shown), or a wireless interface coupled to a transceiver 314. This transceiver can be any appropriate wireless transceiver operating in radio or optical (e.g., infrared) frequencies. In either case, the hardwire interface or wireless interface/transceiver transmits data to a remote computing device via a data communication network and receives data and commands from the remote computing device via the network.

In another embodiment, the aforementioned electronics are embedded in a case that fits around commercially available batteries, similar to the previously-described electronic battery apparatus embodiment having a case, except with a transceiver. As before, the electronic components (including the transceiver) are embedded in a support structure that receives and retains one or more electrical batteries. This structure includes electrical contacts that transfer electrical current from the one or more electrical batteries to the separate electronic device so as to power that device.

3.2 Sensing, Computing and Communication Features Using Two-Way Communication Capability As indicated previously, the electrical battery apparatus with two-way communication capability described herein includes a computing device with a computer program used to at least control the operation of the power control device (if included), transceiver and each sensor, as well as optionally other devices. As such, a variety of advantageous sensing, computing and two-way communication features can be realized.

In one embodiment, the computer program running on the computing device in the electrical battery apparatus includes a module for tracking and recording battery power usage patterns, and a module that employs the aforementioned transceiver to transmit the recorded battery power usage patterns via a standard data communication network to a remote computing device. Thus, in a network having multiple electronic devices each of which employs the electrical battery apparatus, it becomes possible for the remote computer (or group of remote computers in communication with each other) to know the state of the batteries in all the participating host electronic devices.

Knowing the state of the batteries in a group of electronic devices can be quite useful. For example, assuming the electrical battery apparatus of a host electronic device has rechargeable batteries, the remote computer can call for a recharge when the batteries are running low on power. The recharging could be accomplished in one of the ways described previously. As another example, in one embodiment where the computer program running on the computing device in the electrical battery apparatus includes a module for receiving instructions from the remote computer via the data communication network, the remote computer can optimize power consumption by sending an instruction to an electrical battery apparatus in the aforementioned group that instructs the apparatus to modify the amount of power supplied to its host electronic device. The battery power is controlled using the aforementioned power control device (which is included in this embodiment) as described previously. Thus, if multiple host electronic devices and their electrical battery apparatuses are being used in a space (e.g. a house or office) for the same assigned task, it is possible for the remote computing device to instruct an electrical battery apparatus whose batteries are running low on power to minimize the amount of power supplied to its host electronic device or used by the apparatus itself, and then rely on the other devices and their electrical battery apparatuses in the space to accomplish the assigned task (albeit shorthanded). Further, if the remote computer is assigning tasks to a group of electrical battery apparatuses, tasks requiring a higher rate of power consumption can be assigned to electrical battery apparatuses having more power available. Note that the aforementioned tasks can be a variety of things, including, but not limited to, sensing various aspects of the environment using sensors onboard the electrical battery apparatus (e.g., temperature, motion, ambient light conditions, and so on), providing power to a host electronic device to facilitate it in performing a task typical of that host electronic device (e.g., playing music when the host electronic device is a battery-powered wireless speaker), and so on.

4.0 Exemplary Operating Environments

Figure 4:
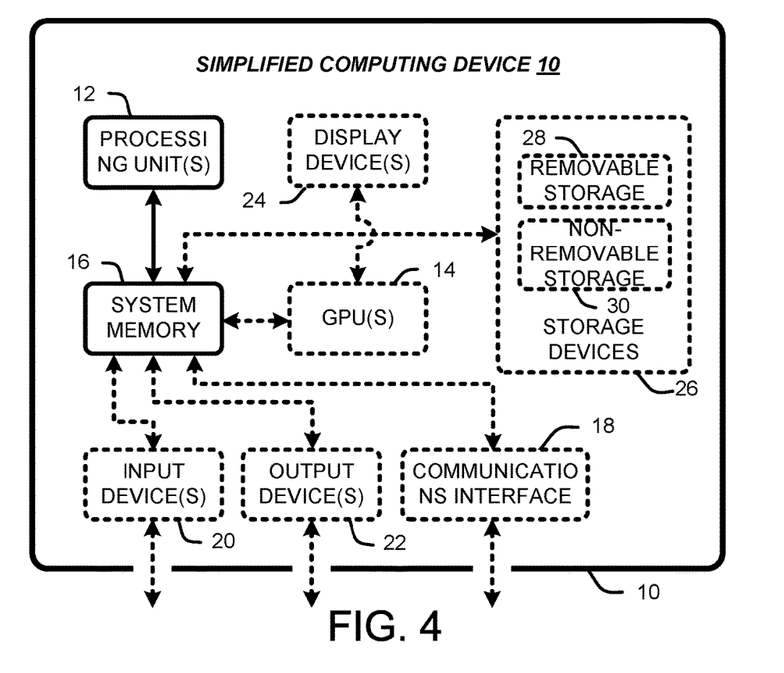
FIG. 4 is a diagram depicting a general purpose computing device constituting an exemplary system for inclusion in electrical battery apparatus embodiments described herein.

The electrical battery apparatus embodiments described herein can employ numerous types of general purpose or special purpose computing system environments or configurations, depending on the computing requirements and the physical space available. FIG. 4 illustrates a simplified example of a general-purpose computer system which various embodiments of the electrical battery apparatus, as described herein, can employ as a computing device. It should be noted that any boxes that are represented by broken or dashed lines in FIG. 4 represent alternate embodiments of the simplified computing device, and that any or all of these alternate embodiments, as described below, may be used in combination with other alternate embodiments that are described throughout this document.

For example, FIG. 4 shows a general system diagram showing a simplified computing device 10. Such computing devices can be typically be found in devices having at least some minimum computational capability, including, but not limited to, personal computers, server computers, hand-held computing devices, laptop or mobile computers, communications devices such as cell phones and PDA's, multiprocessor systems, microprocessor-based systems, set top boxes, programmable consumer electronics, network PCs, minicomputers, mainframe computers, audio or video media players, etc.

To allow a computing device to operate in the electrical battery apparatus embodiments described herein, the device should have a sufficient computational capability and system memory to enable basic computational operations. In particular, as illustrated by FIG. 4, the computational capability is generally illustrated by one or more processing unit(s) 12, and may also include one or more GPUs 14, either or both in communication with system memory 16. Note that that the processing unit(s) 12 of the general computing device may be specialized microprocessors, such as a DSP, a VLIW, or other micro-controller, or can be conventional CPUs having one or more processing cores, including specialized GPU-based cores in a multi-core CPU.

In addition, the simplified computing device of FIG. 4 may also include other components, such as, for example, a communications interface 18. The simplified computing device of FIG. 4 may also include one or more conventional computer input devices 20 (e.g., pointing devices, keyboards, audio input devices, video input devices, haptic input devices, devices for receiving wired or wireless data transmissions, etc.). The simplified computing device of FIG. 4 may also include other optional components, such as, for example, one or more conventional display device(s) 24 and other computer output devices 22 (e.g., audio output devices, video output devices, devices for transmitting wired or wireless data transmissions, etc.). Note that typical communications interfaces 18, input devices 20, output devices 22, and storage devices 26 for general-purpose computers are well known to those skilled in the art, and will not be described in detail herein.

The simplified computing device of FIG. 4 may also include a variety of computer readable media. Computer readable media can be any available media that can be accessed by computer 10 via storage devices 26 and includes both volatile and nonvolatile media that is either removable 28 and/or non-removable 30, for storage of information such as computer-readable or computer-executable instructions, data structures, program modules, or other data. By way of example, and not limitation, computer readable media may comprise computer storage media and communication media. Computer storage media includes, but is not limited to, computer or machine readable media or storage devices such as DVD's, CD's, floppy disks, tape drives, hard drives, optical drives, solid state memory devices, RAM, ROM, EEPROM, flash memory or other memory technology, magnetic cassettes, magnetic tapes, magnetic disk storage, or other magnetic storage devices, or any other device which can be used to store the desired information and which can be accessed by one or more computing devices.

Retention of information such as computer-readable or computer-executable instructions, data structures, program modules, etc., can also be accomplished by using any of a variety of the aforementioned communication media to encode one or more modulated data signals or carrier waves, or other transport mechanisms or communications protocols, and includes any wired or wireless information delivery mechanism. Note that the terms "modulated data signal" or "carrier wave" generally refer to a signal that has one or more of its characteristics set or changed in such a manner as to encode information in the signal. For example, communication media includes wired media such as a wired network or direct-wired connection carrying one or more modulated data signals, and wireless media such as acoustic, RF, infrared, laser, and other wireless media for transmitting and/or receiving one or more modulated data signals or carrier waves. Combinations of the any of the above should also be included within the scope of communication media.

Further, software, programs, and/or computer program products embodying some or all of the various computer modules of the electrical battery apparatus embodiments described herein, or portions thereof, may be stored, received, transmitted, or read from any desired combination of computer or machine readable media or storage devices and communication media in the form of computer executable instructions or other data structures.

Finally, the modules of the electrical battery apparatus embodiments described herein may be further described in the general context of computer-executable instructions being executed by a computing device. Generally, such program modules include routines, programs, objects, components, data structures, etc., that perform particular tasks or implement particular abstract data types. The embodiments described herein may also be practiced in distributed computing environments where tasks are performed by one or more remote processing devices, or within a cloud of one or more devices, that are linked through one or more communications networks. In a distributed computing environment, program modules may be located in both local and remote computer storage media including media storage devices. Still further, the aforementioned instructions may be implemented, in part or in whole, as hardware logic circuits, which may or may not include a processor.

5.0 Other Embodiments

It is noted that any or all of the aforementioned embodiments throughout the description may be used in any combination desired to form additional hybrid embodiments. In addition, although the subject matter has been described in language specific to structural features and/or methodological acts, it is to be understood that the subject matter defined in the appended claims is not necessarily limited to the specific features or acts described above. Rather, the specific features and acts described above are disclosed as example forms of implementing the claims.

Wherefore, what is claimed is:

1. An electrical battery apparatus, comprising:
one or more electrical batteries that power a separate electronic device;
one or more sensors which are incorporated directly into the electrical battery apparatus and monitor conditions external to the electrical battery apparatus;
a computing device which is also incorporated directly into the electrical battery apparatus and is in communication with each sensor; and
a computer program comprising program modules executed by the computing device, wherein the computing device is directed by the program modules of the computer program to at least control the operation of each sensor.

2. The electrical battery apparatus of claim 1, wherein said one or more sensors further monitor electrical battery conditions, and wherein the computer program modules comprise a module for tracking and recording battery power usage patterns.

3. The electrical battery apparatus of claim 2, further comprising a user notification device which is in communication with the computing device, and wherein the computer program modules further comprise a module for notifying a user of the separate electronic device of the recorded battery power usage patterns via the user notification device.

4. The electrical battery apparatus of claim 2, further comprising a transmitter that transmits data and which is in communication with the computing device, and wherein the computer program modules further comprise a module for transmitting the recorded battery power usage patterns via a data communication network to a remote computing device using the transmitter.

5. The electrical battery apparatus of claim 2, further comprising a transmitter that transmits data and which is in communication with the computing device, and wherein the computer program modules further comprise a module for transmitting a request for automatic charging via a data communication network to an automatic charging device or a remote computing device using the transmitter, based on the recorded battery power usage patterns.

6. The electrical battery apparatus of claim 1, wherein the computer program modules comprise a module for tracking and recording sensor data output by each sensor.

7. The electrical battery apparatus of claim 6, further comprising a power control device that controls the amount of power supplied by the one or more electrical batteries to the separate electronic device, and which is in communication with the computing device; and wherein
said one or more sensors further monitor electrical battery conditions; and wherein
the computer program modules further comprise a module for controlling the amount of power supplied to the separate electronic device based on sensor data output by at least one of the one or more sensors, said battery power to the separate electronic device being controlled using said power control device.

8. The electrical battery apparatus of claim 6, further comprising a transmitter that transmits data and which is in communication with the computing device, and wherein the computer program modules further comprise a module for transmitting the recorded sensor data via a data communication network to a remote computing device.

9. The electrical battery apparatus of claim 1, further comprising a location determining device that determines the location of the electrical battery apparatus and which is in communication with the computing device, and wherein the computer program modules further comprise modules for identifying a current location of the electrical battery apparatus using the location determining device.

10. The electrical battery apparatus of claim 9, further comprising a transmitter that transmits data and which is in communication with the computing device, and wherein the computer program modules further comprise a module for transmitting the current location of the electrical battery apparatus via a data communication network to a remote computing device.

11. The electrical battery apparatus of claim 9, further comprising a user notification device which is in communication with the computing device, and wherein the computer program modules further comprise a module for notifying a user of the separate electronic device of the electrical battery apparatus's current location via the user notification device.

12. The electrical battery apparatus of claim 9, further comprising a power control device that controls the amount of power supplied by the one or more electrical batteries to the separate electronic device, and which is in communication with the computing device; and wherein
said one or more sensors further monitor electrical battery conditions; and wherein
the computer program modules further comprise a module for minimizing battery power consumption by the separate electronic device based on the current location of the electrical battery apparatus, said battery power consumption being minimized using said power control device.

13. The electrical battery apparatus of claim 1, wherein the computer program modules further comprise a module for identifying an object that is within a prescribed distance of the electrical battery apparatus based on the output of said one or more sensors.

14. The electrical battery apparatus of claim 13, further comprising a transmitter that transmits data and which is in communication with the computing device, and wherein the computer program modules further comprise a module for transmitting a message via a data communication network to a remote computing device, said message indicating that the electrical battery apparatus is within the prescribed distance of said object.

15. The electrical battery apparatus of claim 13, further comprising a power control device that controls the amount of power supplied by the one or more electrical batteries to the separate electronic device, and which is in communication with the computing device; and wherein
said one or more sensors further monitor electrical battery conditions, and wherein
the computer program modules further comprise a module for supplying power to the separate electronic device only when said object has been identified as being within the prescribed distance of the electrical battery apparatus, said battery power to the separate electronic device being controlled using said power control device.

16. A battery case device, comprising:
a support structure that receives and retains one or more electrical batteries and which comprises electrical contacts that transfer electrical current from the one or more electrical batteries to a separate electronic device so as to power the separate electronic device;
a power control device that controls the amount of power supplied by the support structure to the separate electronic device;
one or more sensors which are incorporated directly into the battery case device, and which monitor electrical battery conditions and conditions external to the battery case device;
a computing device which is also incorporated directly into the battery case device and is in communication with the power control device and each sensor; and
a computer program comprising program modules executed by the computing device, wherein the computing device is directed by the program modules of the computer program to at least control the operation of the power control device and each sensor.

17. The battery case device of claim 16, wherein the support structure fits within a battery compartment of said separate electronic device.

18. The battery case device of claim 16, wherein the computer program modules comprise modules for:
tracking and recording battery power usage patterns;
predicting battery power usage based on the recorded battery power usage patterns; and
minimizing battery power consumption by the battery case device at times of higher power demands based on the predicted battery power usage.

19. The battery case device of claim 16, wherein the computer program modules comprise modules for:
tracking and recording battery power usage patterns;
predicting battery power usage based on the recorded battery power usage patterns; and
minimizing battery power consumption by the separate electronic device at times when based on the predicted battery power usage the separate electronic device is not being used by a user of the separate electronic device, said battery power consumption being minimized using said power control device.

20. An electrical battery apparatus, comprising:
one or more electrical batteries that power a separate electronic device;
a power control device that controls the amount of power supplied by the one or more electrical batteries to the separate electronic device;
one or more sensors which are incorporated directly into the electrical battery apparatus and monitor conditions external to the electrical battery apparatus;

a transceiver that transmits data to a remote computing device via a data communication network and which receives data and commands from a remote computing device via said network;

a computing device which is also incorporated directly into the electrical battery apparatus and is in communication with the power control device and each sensor and the transceiver; and a computer program comprising program modules executed by the computing device, wherein the computing device is directed by the program modules of the computer program to at least control the operation of the power control device and each sensor and the transceiver based at least in part on data and commands received from the remote computing device.

* * * * *